United States Patent
Li et al.

(10) Patent No.: US 8,751,086 B2
(45) Date of Patent: Jun. 10, 2014

(54) ONLINE BATTERY CAPACITY ESTIMATION

(75) Inventors: Yonghua Li, Ann Arbor, MI (US); Richard Dyche Anderson, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 13/590,533

(22) Filed: Aug. 21, 2012

(65) Prior Publication Data

US 2014/0058595 A1 Feb. 27, 2014

(51) Int. Cl.
G06F 7/00 (2006.01)
(52) U.S. Cl.
USPC .............................. 701/22; 180/65.1; 903/903
(58) Field of Classification Search
USPC .............................. 701/22; 180/65.1; 903/903
See application file for complete search history.

(56) References Cited

U.S. PATENT DOCUMENTS

| | | | |
|---|---|---|---|
| 6,534,954 B1 | 3/2003 | Plett | |
| 7,521,895 B2 | 4/2009 | Plett | |
| 2008/0054850 A1 | 3/2008 | Tae et al. | |
| 2009/0037125 A1 | 2/2009 | Plett | |
| 2012/0133369 A1* | 5/2012 | Johnson et al. | 324/427 |

FOREIGN PATENT DOCUMENTS

| | | |
|---|---|---|
| EP | 1873542 A1 | 1/2008 |
| WO | 2006057468 A1 | 6/2006 |

OTHER PUBLICATIONS

"A Nonlinear Adaptive Observer Approach for State of Charge Estimation of Lithium-Ion Batteries", Yonghua Li, R. Dyche Anderson, Jing Song, Anthony M. Phillips, Xu Wang, 2011 American Control Conference, Jun. 29-Jul. 1, 2011.*
Gregory L. Plett, Extended Kalman Filtering for Battery Management Systems of LiPB-based HEV Battery Packs, Part 3. State and Parameter Estimation, Journal of Power Sources 134, May 28, 2004, pp. 277-292, www.sciencedirect.com.
Edward Dean Tate, Jr. et al., Shortest Path Stochastic Control for Hybrid Electric Vehicles, International Journal of Robust and Nonlinear Control, Dec. 5, 2007, pp. 1409-1429, www.interscience.wiley.com.

* cited by examiner

*Primary Examiner* — Mary Cheung
*Assistant Examiner* — Brian P Sweeney
(74) *Attorney, Agent, or Firm* — David B. Kelley; Brooks Kushman P.C.

(57) ABSTRACT

An electric vehicle includes a controller configured to estimate battery capacity in accordance with a first state of charge estimation, a charge integration, and a second state of charge estimation. The first and second state of charge estimations are in accordance with time and temperature constraints and are such that the estimated battery capacity has limited uncertainty. The controller is further configured to generate an output based on the estimated battery capacity.

17 Claims, 3 Drawing Sheets

ONLINE BATTERY CAPACITY ESTIMATION

TECHNICAL FIELD

The disclosure relates to online battery capacity estimation that may be used in various types of electric and hybrid electric vehicles, for example.

BACKGROUND

Hybrid vehicles come in different forms, may use different energy storage devices, and serve different customer needs. Existing hybrid vehicles include hybrid electric vehicles (HEVs), which use batteries as the energy storage system. The plug-in hybrid electric vehicle (PHEV) is an extension of existing hybrid electric vehicle (HEV) technology. A PHEV utilizes a larger capacity battery pack than a standard hybrid vehicle, and adds the capability to recharge the battery from a standard electrical outlet to decrease fuel consumption and to further improve the fuel economy in an electric driving mode or in a blended driving mode. There are also battery electric vehicle (BEV) applications where an electric machine completely replaces the internal combustion engine.

In most hybrid electric vehicles (HEVs), only a small portion of the battery capacity is generally used, therefore capacity may be assumed constant. In a plug-in hybrid electric vehicle (PHEV) or battery electric vehicle (BEV), battery capacity fade may have a significant impact. Battery state of charge (SOC) is defined as percentage of available charge as compared with the maximum charge capacity. For example, the well-known SOC calculation using amp-hour integration in part depends on a predetermined battery capacity:

$$SOC(k+1) = SOC(k) - T_s * \frac{\eta * I(k)}{Q} \quad (1)$$

where SOC is the state of charge, Ts is the time interval, η is the charge/discharge efficiency, I is the current, and Q is the capacity.

For the foregoing reasons, there is a need to infer battery capacity based on battery behavior and data.

Background information may be found in US 2008/0054850 A1, EP 1873542 B1, WO 06057468 A1. Further background information may be found in: Plett, Extended Kalman filtering for battery management systems of LiPB-based HEV battery packs Part 3. State and parameter estimation, Journal of Power Sources 134, pages 277-292, Elsevier, 2004; Tate, Jr. et al., Shortest path stochastic control for hybrid electric vehicles, International Journal of Robust and Nonlinear Control 18, pages 1409-1429, Wiley, 2007.

SUMMARY

In one embodiment, an electric vehicle comprises a controller configured to estimate battery capacity in accordance with a first state of charge estimation, a charge integration, and a second state of charge estimation. The first and second state of charge estimations are in accordance with time and temperature constraints and are such that the estimated battery capacity has limited uncertainty. The controller is further configured to generate an output based on the estimated battery capacity.

In one possible feature, the controller is configured to estimate the first and second state of charge estimations independent from the charge integration. That is, the state of charge parameters used to calculate capacity are calculated in a different manner. In another possible feature, the controller is configured to calculate an uncertainty of the estimated battery capacity. This particular feature provides a mathematical model to combine sources of error to determine when capacity may be updated with confidence. Accordingly, state of charge may be calculated in a variety of ways, and embodiments of the invention do not require any single particular way of calculating state of charge.

In one embodiment, an electric vehicle comprises a controller configured to monitor keyoff events and estimate battery capacity in accordance with a first state of charge estimation, a charge integration, and a second state of charge estimation. The first and second state of charge estimations correspond to respective first and second consecutive keyoff events and are in accordance with time and temperature constraints such that the state of charge estimations are based on battery open circuit voltages. The controller is further configured to generate an output based on the estimated battery capacity.

It is appreciated that embodiments of the invention may include one or more additional features, individually or in various combinations. As well, embodiments of the invention may be used in electric vehicles including, for example, plug-in hybrid electric vehicles (PHEVs), battery electric vehicles (BEVs), or other electric vehicle applications. Further, it is appreciated that the keyoff events and keyon events may be interpreted to mean main battery contactor open and close events, as push button events (for push button start and stop applications), or any other similar events as understood by those skilled in the art.

In one feature, the first state of charge estimation is based on a first battery open circuit voltage measured not less than a first predetermined amount of time after the first keyoff event. In a further feature, the first battery open circuit voltage is measured not more than a predetermined time limit after the first keyoff event. In another feature, the first battery open circuit voltage is measured when a battery temperature is not less than a minimum temperature calibration value. In another feature, the first battery open circuit voltage is measured when a battery temperature is not more than a maximum temperature calibration value.

In a further feature, the second state of charge estimation is based on a second battery open circuit voltage measured not less than a second predetermined amount of time after the second keyoff event. In another feature, the first battery open circuit voltage is measured when a battery temperature is a first temperature, the second battery open circuit voltage is measured when the battery temperature is a second temperature, a difference between the first and second temperatures being not more than a delta temperature calibration value.

In one aspect of the invention, the time and temperature constraints are selected from a group including (i) a first set of constraints to allow state of charge estimations based on battery open circuit voltages, and (ii) a second set of constraints that is relaxed relative to the first set of constraints while still allowing state of charge estimations based on battery open circuit voltages.

In another aspect of the invention, the second state of charge estimation is based on a second battery open circuit voltage measured not less than a second predetermined amount of time after the second keyoff event, and the controller includes a wakeup timer, the wakeup timer configured to awaken the controller after the second keyoff event.

In another aspect of the invention, the estimated battery capacity is subjected to an upper bound and a lower bound for allowed variation between a current estimated battery capacity and a previous estimated battery capacity.

In another aspect of the invention, the controller is further configured to avoid estimating battery capacity when an on-plug charge event occurs between the first and second state of charge estimations.

In another aspect of the invention, the controller is further configured to permit estimating battery capacity when a cell balancing event occurs between the first and second state of charge estimations.

In another embodiment, a method of controlling an electric vehicle is provided. The method comprises monitoring keyoff events; and estimating battery capacity in accordance with a first state of charge estimation, a charge integration, and a second state of charge estimation. The first and second state of charge estimations correspond to respective first and second consecutive keyoff events and are in accordance with time and temperature constraints such that the state of charge estimations are based on battery open circuit voltages. The method further comprises generating an output based on the estimated battery capacity.

DETAILED DESCRIPTION

Figure 1:
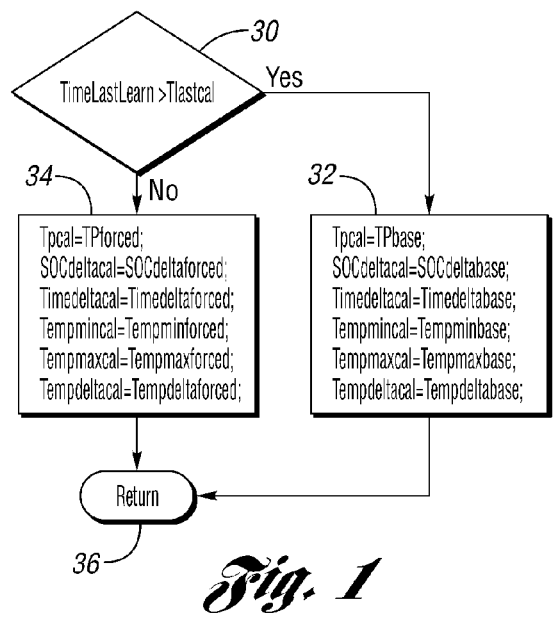
FIG. 1 is a flowchart illustrating calibration selection for base and forced capacity learning.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

If the state of charge is known well enough, capacity could be calculated as follows:

$$Q = \frac{\sum I \Delta t}{(SOC_i - SOC_f)} \quad (2)$$

where Q is the capacity, I is the current, $\Delta t$ is the sampling time, $SOC_f$ and $SOC_i$ are final and initial state of charge, respectively.

The uncertainty associated with the solution of Equation (2) can be expressed as:

$$Q = \frac{\sum I \Delta t}{(SOC_i - SOC_f)} \pm$$

$$\left(\frac{\sum I \Delta t}{(SOC_i - SOC_f)}\right) \sqrt{\left(\frac{U(\sum I \Delta t)}{\sum I \Delta t}\right)^2 + \left(\frac{U(SOC_i)^2 + U(SOC_f)^2}{(SOC_i - SOC_f)}\right)^2} \quad (3)$$

The uncertainty factors shown in Equation (3) suggest that the throughput has to be significant, yet the time duration has to be short, to estimate capacity Q accurately. Also, the delta SOC has to be sufficiently large, and the SOC calculation has to be independent of the capacity Q.

Before proceeding to the detailed algorithm description for an example embodiment, the following are a set of base calibrations.

| Variable | Default Value | Physical Meaning |
| --- | --- | --- |
| TPbase | 5 ampere-hour | Minimum ampere-hour value (throughput) for a given drive cycle based on which capacity learning can be carried out. |
| SOCdeltabase | 25% | Minimum difference in SOC in two consecutive KeyOff-KeyOn events based on which capacity learning can be carried out. |
| Timedeltabase | 1800 seconds | Maximum time duration for a given drive cycle based on which capacity learning can be carried out. |
| Tempminbase | 0° C. | Minimum battery temperature during KeyOff to KeyOn, based on which capacity learning can be carried out. |
| Tempmaxbase | 60° C. | Maximum battery temperature during KeyOff to KeyOn, based on which capacity learning can be carried out. |
| Tempdeltabase | 20° C. | Maximum delta temperature between two KeyOff to KeyOn events during which capacity learning can be carried out. |

One special case is that due to all the limitations based on calibration values, capacity learning may not have been done for over an extended period of time. If this is the case, then there is a need to force a capacity learning event (i.e., probably relaxing some requirements (but not all, due to accuracy requirements)).

To this end, a second set of calibrations for capacity learning is used. They are:

| Variable | Default Value | Physical Meaning |
| --- | --- | --- |
| TPforced | 1 ampere-hour | Minimum ampere-hour value (throughput) for a given drive cycle based on which capacity learning can be carried out when forced. |
| SOCdeltaforced | 10% | Minimum difference in SOC in two consecutive KeyOff-KeyOn event based on which capacity learning can be carried out when forced. |
| Timedeltaforced | 3600 seconds | Maximum time duration for a given drive cycle based on which capacity learning can be carried out when forced. |
| Tempminforced | −10° C. | Minimum battery temperature during KeyOff to KeyOn, based on which capacity learning can be carried out when forced. |
| Tempmaxforced | 65° C. | Maximum battery temperature during KeyOff to KeyOn, based on which capacity learning can be carried out when forced. |
| Tempdeltaforced | 30° C. | Maximum delta temperature between two KeyOff to KeyOn events during which capacity learning can happen when forced. |

A timer is used to trace how long ago capacity learning was carried out. If this timer is larger than a certain calibration value, the above relaxed calibration variables will be used instead to determine if capacity learning should be carried out. This time is reset whenever a capacity learning is successful.

| Variable | Default Value | Physical Meaning |
| --- | --- | --- |
| TimeLastLearn | 1 month | Maximum calendar time elapse based on which capacity learning is carried out with relaxed set of calibration variables. |

FIG. 1 is a flowchart illustrating calibration selection for base and forced capacity learning. Flow begins at decision block 30. At decision block 30 when the time since the last calibration (Tlastcal) is less than the calibration value TimeLastLearn, flow proceeds to block 32 and the base calibrations are used. When the time since the last calibration (Tlastcal) is not less than the calibration value TimeLastLearn, flow proceeds to block 34 and the forced calibrations are used. Flow ends at block 36.

Because battery capacity can sometimes increase in early age of the battery, a feature that may be included in the algorithm is: during early calendar life of the battery, consider capacity change as unbounded above (i.e., it can surpass its last value); after battery calendar life passes a certain calibration value, estimated capacity shall be limited by its last value. Also, in order to avoid erroneous capacity learning, an upper bound and lower bound for allowed variation between learned value and last recorded value are provided.

Figure 2:
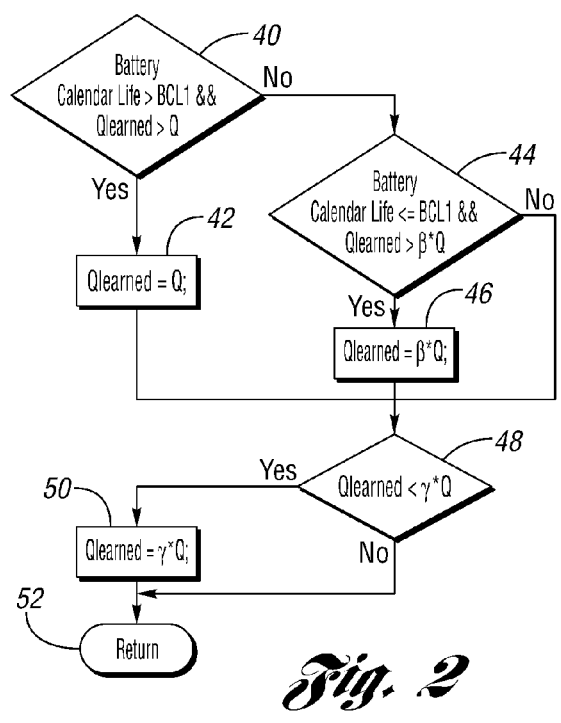
FIG. 2 illustrates a flow diagram for capacity bounding during the learning process.

FIG. 2 illustrates a flow diagram for capacity bounding during the learning process. In more detail, at block 40, the current battery calendar life is compared to the calibration value BCL1, and the (preliminary) learned capacity Qlearned is compared to the last capacity value Q. When the battery calendar life has passed BCL1, Qlearned is limited by Q at block 42. In other cases, decision block 44 checks for an early age of the battery and, when learned capacity Qlearned exceeds beta*Q, Qlearned is limited by beta*Q at block 46.

Decision block 48 compares Qlearned to gamma*Q, and when learned capacity Qlearned falls below gamma*Q, Qlearned is limited by gamma*Q. Flow ends at block 52.

Another feature that may be included in the algorithm relates to handling a charge event. During KeyOff time, a charge event may occur in that the customer plugs the battery into a charge station or home plug to recharge the battery. This will have the following effects. First, battery rest time (KeyOff time) will be impacted. KeyOff time used for capacity learning purpose will have to be from the end of the charge event to key-on. Second, charge event normally brings significant change in throughput. Charge and discharge efficiencies are different. Hence, such charge event related throughput, if used for capacity learning, may cause noticeable error in throughput calculation. To this end, when there is a charge event, the learning process is terminated and all last drive cycle values related to capacity learning and stored in EEPROM are cleared.

Another feature that may be included in the algorithm relates to handling a cell balancing event. Cell balancing refers to the situation where due to imbalance of state of charge among cells, higher SOC cells will have to be discharged, either passively or actively, so overall cell state of charge levels are about the same.

When cell balancing event occurs during a KeyOff period, it impacts the algorithm in the ways similar to charge event, except that it is in the cell level (in contrast, a charge event occurs in all cells in a series connection), and that cell balancing is discharge, and the quantity of throughput is small compared with the accumulated throughput during a drive cycle. Also, simulation of the equivalent circuit of the cell shows a small constant discharge current does not affect OCV reading significantly (well within voltage measurement accuracy range). Hence, cell balancing event will be considered for its impact on throughput calculation, yet it will not be considered for KeyOff Timer update.

To this end, the algorithm will deal with cell balancing event by performing the following once a cell balancing event is determined. First, the throughput will be modified based on cell balancing current and duration. Second, the KeyOff timer will not be updated.

Another feature that may be included in the algorithm relates to self-discharge and parasitic electronic loads. Self-discharge is a well-known phenomenon in which a battery will lose some of its state of charge while simply sitting unused. Parasitic electronic loads are power draw on the battery from loads such as sensing electronics which get their power from the cells. The power draw is reduced when the vehicle is off, but is not necessarily zero. If there is considerable self-discharge or parasitic loads, then the charge integration term would be too low and capacity would be understated. Put another way, the uncertainty of the charge integration term increases. In one approach to address self-discharge and/or electronic parasitic loads, a calibration in deciding whether the KeyOff time is too long is added.

Another feature that may be included in the algorithm relates to battery energy control module (BECM) wake-up after KeyOff event. The BECM normally shuts off after KeyOff event. Unless there is a mechanism to wake-up the BECM module when battery has reached a steady-state, there is no other means to measure the open circuit voltage for capacity learning purpose. To this end, a timer based wake-up strategy is proposed.

At KeyOff event, determine if accumulated current throughput and elapsed time satisfy the capacity learning requirement. Either base calibration or forced learning calibration can be used depending on if enough time has passed since last capacity learning.

If the above condition is satisfied, a timer circuit or similar hardware can be used to trigger the BECM wake-up. The timer is set at the minimum calibration used for the battery to reach steady-state. This timer wake-up is used in parallel to the charge event and cell balancing event for any given battery cell.

Based on the above, the following detailed algorithm is used in the example embodiment for capacity estimation of a Li-ion battery.

Figure 3:
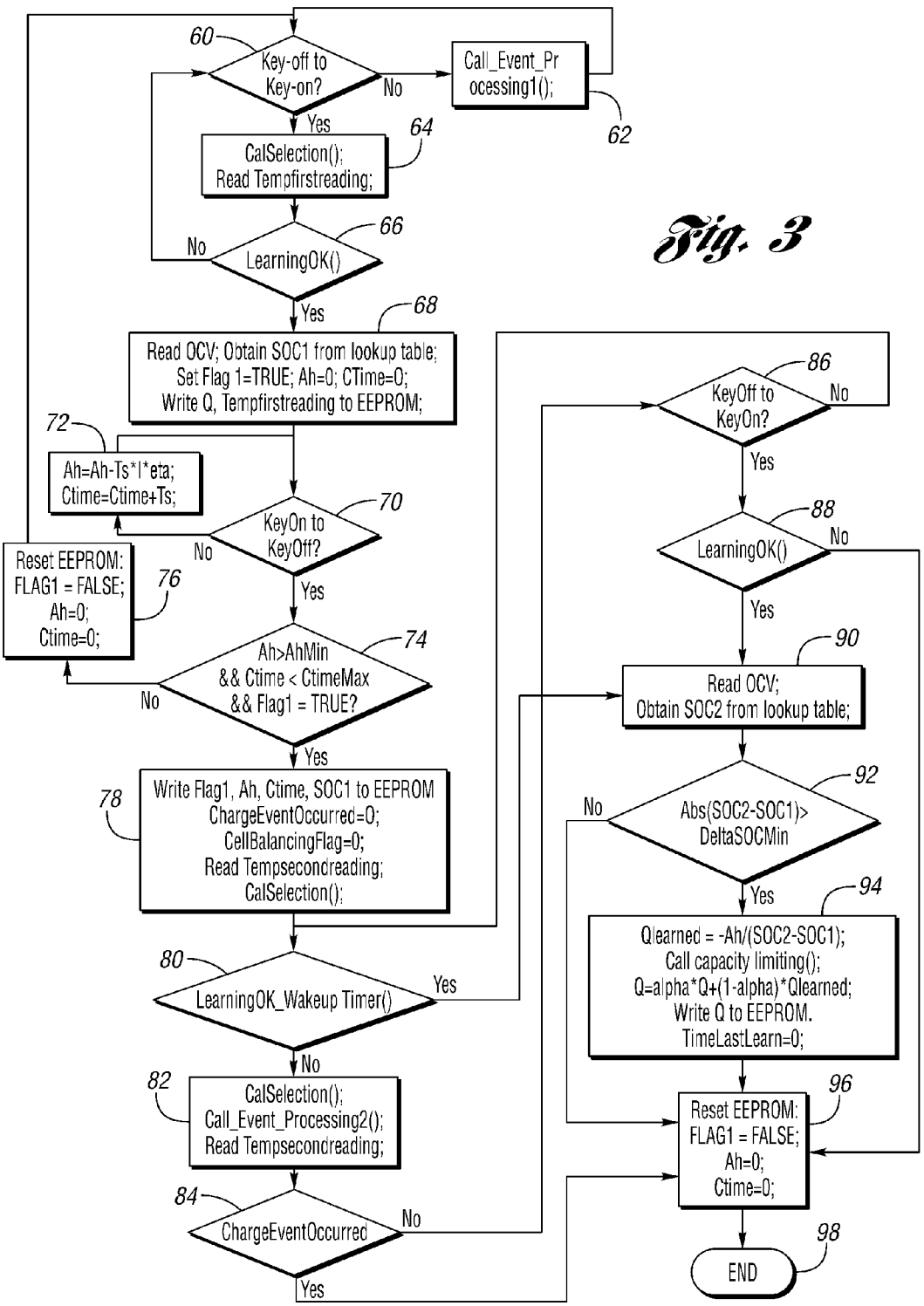
FIG. 3 illustrates the general sequence of actions in the detailed algorithm main routine in the example embodiment of the invention for online battery capacity estimation.

FIG. 3 illustrates the general sequence of actions in the detailed algorithm main routine in the example embodiment of the invention for online battery capacity estimation. Flow begins at decision block 60. Decision block 60 waits for KeyOff to KeyOn. If KeyOff to KeyOn does not occur, flow proceeds to block 62. Block 62 handles charge event and cell balancing event before the first OCV value is read, and is shown in more detail in FIG. 4. If KeyOff to KeyOn does occur, flow proceeds to block 64. At block 64, calibration selection is performed, and is shown in further detail in FIG. 1. In addition, a first temperature reading of the battery is taken. Flow proceeds to block 66.

Figure 6:
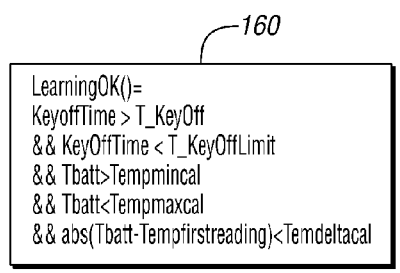
FIG. 6 illustrates the determination if various constraints are met to allow learning.

At decision block 66, the system checks to see that various constraints are met to allow learning. Details of this are shown in FIG. 6. If the constraints are not met, flow returns to block 60. If the constraints are met, flow proceeds to block 68. At block 68, the battery open circuit voltage (OCV) is read, and the corresponding first state of charge (SOC1) is obtained from a lookup table mapping OCV to SOC. To begin the learning process, Flag1 is set to TRUE, Ah is initialized to 0, Ctime is initialized to 0. The current capacity estimate Q and the first temperature reading are written to EEPROM.

Decision block 70 waits for KeyOn to KeyOff. Prior to KeyOff detection, amp-hour integration is performed (Ah) and drive cycle time (Ctime) is incremented at block 72. When the KeyOff does occur, flow proceeds to decision block 74. At decision block 74, some requirements are checked, including amp-hour integration result (Ah) exceeding a minimum amp-hour value (AhMin) for the drive cycle, drive cycle time (Ctime) falling below a maximum drive cycle time duration (CtimeMax), Flag1 being TRUE. If the requirements are met, flow proceeds to block 78. At block 78, Flag1, Ah, Ctime, and SOC1 are written to EEPROM; ChargeEventOccurred and CellBalancingFlag are cleared to 0. A second battery temperature reading is read, and calibration selection is performed before decision block 80. If the requirements were not met, flow from block 74 proceeds to block 76 where EEPROM is reset: Flag1=FALSE; Ah=0; Ctime=0.

Figure 7:
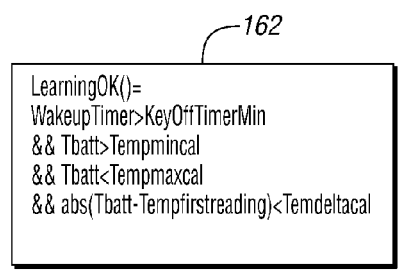
FIG. 7 illustrates the determination if various constraints are met to allow learning, when a wake-up timer is used.

At decision block 80, the system checks to see that various constraints are met to allow learning. Details of this are shown in FIG. 7, and this example includes the wake-up timer. If conditions are such that learning is allowed, flow proceeds to block 90. Otherwise, flow proceeds to block 82. At block 82, calibration selection is performed (FIG. 1), and Call_Event_Processing2 handles charge event and cell balancing event before the second OCV is read for capacity learning purposes, with further details shown in FIG. 5. In addition, a second temperature reading of the battery is taken.

At decision block 84, when a charge event occurs before the second state of charge estimation, learning is prohibited and flow proceeds to block 96. If a charge event does not occur, flow proceeds to block 86. Decision block 86 checks for a KeyOff to KeyOn event. When KeyOn does not occur, flow returns to block 80. When KeyOn does occur, flow proceeds to block 88. At decision block 88, the system checks to see that various constraints are met to allow learning. Details of this are shown in FIG. 6. If the constraints are not met, flow proceeds to block 96. If the constraints are met, flow proceeds to block 90.

At block 90, the battery open circuit voltage (OCV) is read, and the corresponding second state of charge (SOC2) is obtained from a lookup table mapping OCV to SOC. Flow proceeds to block 92, where the constraint for the minimum absolute difference in SOC between consecutive KeyOff to KeyOn events (DeltaSOCMin) is checked.

At block 94, the preliminary learned capacity is calculated according to:

$$Qlearned = -Ah/(SOC2-SOC1)$$

A function (capacitylimiting( )) is called that subjects the estimated battery capacity to an upper bound and a lower bound for allowed variation. Further details of this limiting are shown in FIG. 2. After the limiting function, Q is determined according to:

$$Q = alpha*Q + (1-alpha)*Qlearned$$

Q is written to EEPROM and the TimeLastLearn is reset to 0.

At block 96, EEPROM is reset: Flag1=FALSE; Ah=0; Ctime=0. Flow ends at block 98.

Figure 4:
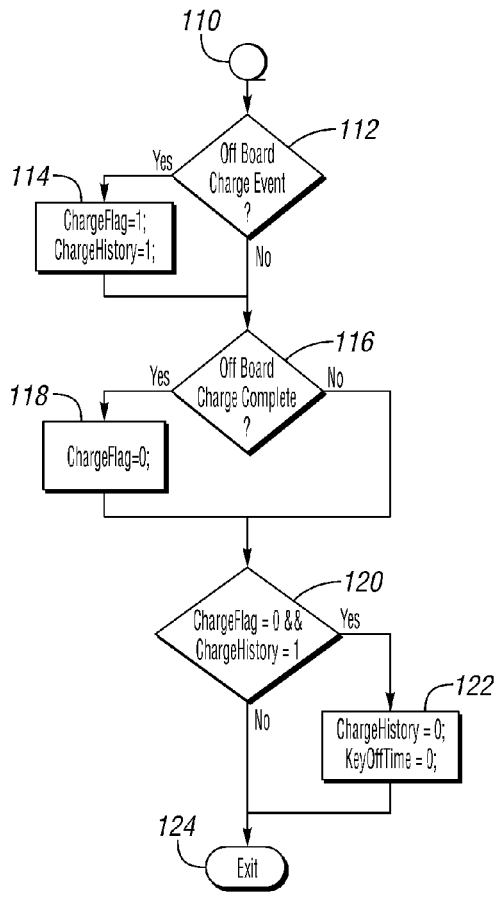
FIG. 4 illustrates a routine for handling charge events and cell balancing events before the first open circuit voltage (OCV) value is read.

FIG. 4 illustrates a routine for handling charge events and cell balancing events before the first open circuit voltage (OCV) value is read (Call_Event_Processing1( ) block 62, FIG. 3). Flow begins at 110. At decision block 112, if an off board charge event is detected, flow proceeds to block 114. Otherwise, flow proceeds directly to decision block 116. At block 114, values are set: ChargeFlag=1; ChargeHistory=1. From block 114, flow proceeds to block 116. At decision block 116, if the off board charge is complete, flow proceeds to block 118. Otherwise, flow proceeds directly to block 120. At block 118, the charge flag is cleared: ChargeFlag=0. From block 118, flow proceeds to block 120. At decision block 120, if the charge flag is cleared and the charge history flag is set (ChargeFlag=0 and ChargeHistory=1), flow proceeds to block 122. Otherwise, flow proceeds directly to block 124. At block 122, the charge history flag is cleared and the key-off timer is reset (ChargeHistory=0; KeyOffTime=0). Flow ends at block 124.

Figure 5:
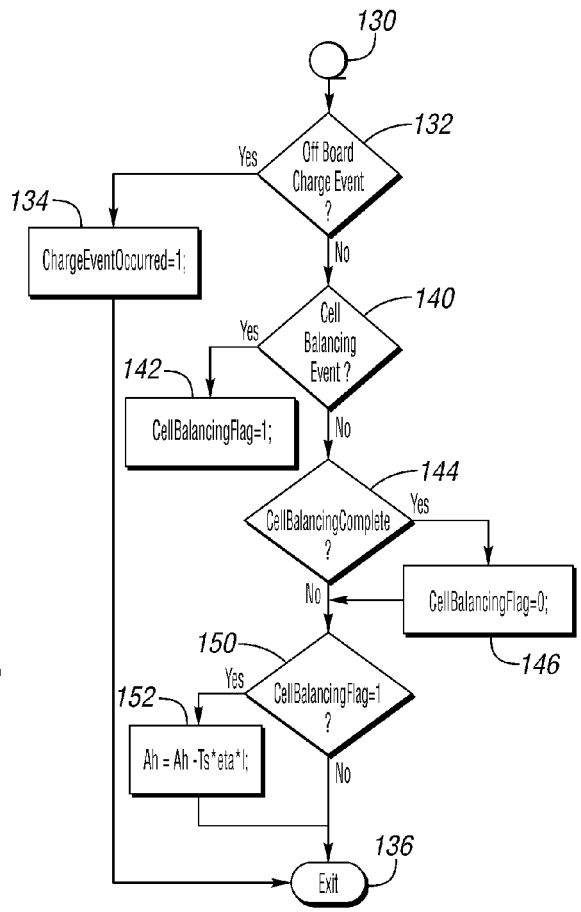
FIG. 5 illustrates a routine for handling charge events and cell balancing events before the second open circuit voltage (OCV) value is read.

FIG. 5 illustrates a routine for handling charge events and cell balancing events before the second open circuit voltage (OCV) value is read (Call_Event_Processing2( ) block 82, FIG. 3). Flow begins at block 130. At decision block 132, if an off board charge event is detected, flow proceeds to block 134. Otherwise, flow proceeds to decision block 140. At block 134, the charge event occurred flag is set (ChargeEventOccurred=1), and flow proceeds to block 136. At decision block 140, if a cell balancing event occurs, flow proceeds to block 142. Otherwise, flow proceeds directly to block 144. At block 142, the cell balancing flag is set (CellBalancingFlag=1), and flow proceeds to block 144.

At decision block 144, if cell balancing is complete, flow proceeds to block 146 and the cell balancing flag is cleared (CellBalancingFlag=0). Flow continues at decision block 150. Amp-hour integration takes place when the cell balancing flag is set, at block 152 (Ah=Ah−Ts*eta*I). When the cell balancing flag is clear, flow ends at block 136.

FIG. 6 illustrates the determination if various constraints are met to allow learning, at 160. KeyOff time (KeyoffTime) must be greater than a predetermined amount of time (T_KeyOff), and must be less than a predetermined time limit (T_KeyOffLimit). Battery temperature (Tbatt) must be greater than a minimum calibration value (Tempmincal), and must be less than a maximum calibration value (Tempmaxcal). An absolute difference between the first battery temperature reading (Tempfirstreading) and the current battery temperature reading (Tbatt) must be less than a delta temperature calibration value (Temdetacal).

FIG. 7 illustrates the determination if various constraints are met to allow learning, when a wake-up timer is used, at 162. The first condition (WakeupTimer>KeyOffTimerMin) makes sure the BECM wake up occurs after KeyOff for a long enough time. Battery temperature (Tbatt) must be greater than a minimum calibration value (Tempmincal), and must be less than a maximum calibration value (Tempmaxcal). An absolute difference between the first battery temperature reading (Tempfirstreading) and the current battery temperature reading (Tbatt) must be less than a delta temperature calibration value (Temdetacal).

Embodiments of the invention are not limited to those described herein. Various other embodiments are possible within the scope of the invention. For example, the first and second state of charge estimations used to calculate capacity may be calculated independently from the charge integration in a variety of ways. One example is to calculate the state of charge estimations based on open circuit voltages. Other methods could be used, depending on the battery chemistry as readily appreciated and understood by one of ordinary skill in the art. In another example, capacity could be calculated during charge instead of discharge, if the battery chemistry and uncertainty terms allow.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electric vehicle comprising:
a controller programmed to monitor keyoff events and estimate battery capacity in accordance with a first state of charge (SOC) estimation, a charge integration, and a second SOC estimation;
the first and second SOC estimations corresponding to respective first and second consecutive keyoff events and being in accordance with time and temperature constraints such that the SOC estimations are based on battery open circuit voltages;
the controller being further configured to generate an output based on the estimated battery capacity.

2. The electric vehicle of claim 1, wherein the first SOC estimation is based on a first battery open circuit voltage measured not less than a first predetermined amount of time after the first keyoff event.

3. The electric vehicle of claim 2, wherein the first battery open circuit voltage is measured not more than a predetermined time limit after the first keyoff event.

4. The electric vehicle of claim 2, wherein the first battery open circuit voltage is measured when a battery temperature is not less than a minimum temperature calibration value.

5. The electric vehicle of claim 2 wherein the first battery open circuit voltage is measured when a battery temperature is not more than a maximum temperature calibration value.

6. The electric vehicle of claim 2, wherein the second SOC estimation is based on a second battery open circuit voltage measured not less than a second predetermined amount of time after the second keyoff event.

7. The electric vehicle claim 6 wherein the first battery open circuit voltage is measured when a battery temperature is a first temperature, the second battery open circuit voltage is measured when the battery temperature is a second temperature, a difference between the first and second temperatures being not more than a delta temperature calibration value.

8. The electric vehicle of claim 2, wherein the time and temperature constraints are selected from a group including (i) a first set of constraints to allow SOC estimations based on battery open circuit voltages, and (ii) a second set of constraints that is relaxed relative to the first set of constraints while still allowing SOC estimations based on battery open circuit voltages.

9. The electric vehicle of claim 2, wherein the second SOC estimation is based on a second battery open circuit voltage measured not less than a second predetermined amount of time after the second keyoff event, and wherein the controller includes a wakeup timer, the wakeup timer configured to awaken the controller after the second keyoff event.

10. The electric vehicle of claim 1, wherein the estimated battery capacity is subjected to an upper bound and a lower bound for allowed variation between a current estimated battery capacity and a previous estimated battery capacity.

11. The electric vehicle of claim 1, wherein the controller is further configured to avoid estimating battery capacity when a charge event occurs between the first and second SOC estimations.

12. The electric vehicle of claim 1, wherein the controller is further configured to permit estimating battery capacity when a cell balancing event occurs between the first and second SOC estimations.

13. A method of controlling an electric vehicle, comprising:
generating, by a controller, an output based on an estimated battery capacity based on a first state of charge (SOC) estimation, a charge integration, and a second SOC estimation;
the first and second SOC estimations corresponding to respective first and second consecutive keyoff events and being in accordance with time and temperature constraints such that the SOC estimations are based on battery open circuit voltages.

14. The method of claim 13, wherein the first SOC estimation is based on a first battery open circuit voltage measured not less than a first predetermined amount of time after the first keyoff event.

15. The method of claim 14, wherein the first battery open circuit voltage is measured not more than a predetermined time limit after the first keyoff event.

16. The method of claim 14, wherein the first battery open circuit voltage is measured when a battery temperature is not less than a minimum temperature calibration value.

17. The method of claim 14 wherein the first battery open circuit voltage is measured when a battery temperature is not more than a maximum temperature calibration value.

\* \* \* \* \*